United States Patent
Gilbert et al.

(10) Patent No.: US 10,826,247 B1
(45) Date of Patent: Nov. 3, 2020

(54) ELECTROMAGNETIC SHIELDING SYSTEMS AND METHODS FOR AIRCRAFT

(71) Applicant: THE BOEING COMPANY, Chicago, IL (US)

(72) Inventors: Eric B. Gilbert, Mukilteo, WA (US); Andrew M. Robb, Ravensdale, WA (US); Jason A. Fraser, Snohomish, WA (US); Steven E. Klein, Tacoma, WA (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 16/431,779

(22) Filed: Jun. 5, 2019

(51) Int. Cl.
  *H05K 9/00* (2006.01)
  *H01R 13/6591* (2011.01)
  *H01B 9/02* (2006.01)
  *B64D 45/02* (2006.01)
  *H02H 1/04* (2006.01)

(52) U.S. Cl.
  CPC ......... *H01R 13/6591* (2013.01); *B64D 45/02* (2013.01); *H01B 9/02* (2013.01); *H02H 1/04* (2013.01)

(58) Field of Classification Search
  USPC .......................................... 361/818
  See application file for complete search history.

(56) References Cited

U.S. PATENT DOCUMENTS

| 5,008,487 A * | 4/1991 | Shimmyo | H05K 5/0008 174/353 |
|---|---|---|---|
| 9,769,962 B2 * | 9/2017 | Huang | H05K 7/20927 |
| 2006/0233496 A1 * | 10/2006 | Khemakhem | G02B 6/3817 385/75 |
| 2011/0194246 A1 * | 8/2011 | Nakasaka | H05K 7/20927 361/688 |

* cited by examiner

*Primary Examiner* — Hung S. Bui
(74) *Attorney, Agent, or Firm* — The Small Patent Law Group LLC; Joseph M. Butscher

(57) ABSTRACT

An electromagnetic shielding system is configured to shield one or more electrical connections between one or more first electrical cables and one or more second electrical cables. The electromagnetic shielding system includes a base. A first cable coupler is frangibly coupled to the base. The first cable coupler is configured to electrically couple to the first electrical cable(s). A second cable coupler is frangibly coupled to the base. The second cable coupler is configured to electrically couple to the second electrical cable(s). A covering lid is frangibly coupled to the first cable coupler, the second cable coupler, and the base. An electrical connection chamber is defined between the base, the first cable coupler, the second cable coupler, and the covering lid. The first electrical cable(s) are configured to electrically connect to the second electrical cable(s) within the electrical connection chamber.

25 Claims, 6 Drawing Sheets

ELECTROMAGNETIC SHIELDING SYSTEMS AND METHODS FOR AIRCRAFT

FIELD OF THE DISCLOSURE

Embodiments of the present disclosure generally relate to electromagnetic shielding systems and methods, such as may be used to shield electrical connections within an aircraft from external electromagnetic threats.

BACKGROUND OF THE DISCLOSURE

Aircraft include numerous components that are powered. For example, an aircraft includes engines, which may be coupled to wings. Electrical cables, such as power feeders, are electrically coupled to the engines in order to provide electrical power to (or receive electrical power from) the engines.

Typically, a power feeder within an aircraft is a large gauge conductor having a core of electrical wires that are surrounded by insulation and a metallic mesh shield. The mesh shield protects the internal electrical wires from external energy, such as electromagnetic pulses, high intensity radiated fields, lighting strikes, and the like.

Certain regulations require that power feeders have the ability to break away proximate to an engine on an aircraft in the event that the engine separates from the aircraft (such as during an impact), in order to protect a fuel tank from being damaged by the separating engine. As such, instead of having a continuous power feeder from the aircraft to the engine, the power feeders terminate at a terminal block proximate to the engine. The power feeders electrically connect to cables extending from the engine at the terminal block. In the event that the engine separates from the aircraft, the cables from the engine separate at the terminal block.

However, the terminal block may not be shielded. As such, external electromagnetic energy may be directed into electrical connections at or within the terminal block. For example, an electrical surge from a lighting strike may damage the electrical connection within the terminal block.

SUMMARY OF THE DISCLOSURE

A need exists for a system and a method for electrically shielding a terminal block within a portion of an aircraft. Further, a need exists for a system and a method for shielding electrical connections between power feeders and other cables, such as within a portion of an aircraft.

With those needs in mind, certain embodiments of the present disclosure provide an electromagnetic shielding system that is configured to shield one or more electrical connections between one or more first electrical cables and one or more second electrical cables. The electromagnetic shielding system includes a base. A first cable coupler is frangibly coupled to the base. The first cable coupler is configured to electrically couple to the first electrical cable(s). A second cable coupler is frangibly coupled to the base. The second cable coupler is configured to electrically couple to the second electrical cable(s). A covering lid is frangibly coupled to the first cable coupler, the second cable coupler, and the base. An electrical connection chamber is defined between the base, the first cable coupler, the second cable coupler, and the covering lid. The first electrical cable(s) are configured to electrically connect to the second electrical cable(s) within the electrical connection chamber.

In at least one embodiment, a terminal block is within the electrical connection chamber. The terminal block is configured to electrically connect the first electrical cable(s) to the second electrical cable(s).

In at least one embodiment, the electromagnetic shielding system also includes a first lid attachment bracket frangibly coupled to the base, and a second lid attachment bracket frangibly coupled to the base. The covering lid is frangibly coupled to the first lid attachment and the second lid attachment.

The base may include a support plate that is configured to be securely mounted to a component, a first end wall extending from the support plate, a first side wall extending from the support plate and connected to the first end wall, a second end wall opposite from the first end wall extending from the support plate and connected to the first side wall, and a second side wall opposite from the first side wall extending from the support plate and connected to first end wall and the second end wall.

In at least one embodiment, the first cable coupler includes a first fitting frangibly coupled to a second fitting, and the second cable coupler includes a third fitting frangibly coupled to a fourth fitting. In at least one example, the first fitting includes one or more first cable collars, and the second fitting includes one or more second cable collars. The first fitting is coupled to the second fitting so that outer portions of the first electrical cable(s) are securely and electrically coupled to the first cable collar(s) and the second cable collar(s).

In at least one embodiment, the covering lid includes a main covering wall and side walls extending from the main covering wall. The covering lid may also include flanges outwardly extending from the side walls. The flanges are frangibly coupled to lid attachment brackets.

In at least one embodiment, one or more ventilation passages are formed through one or more of the base, the first cable coupler, the second cable coupler, or the covering lid.

Certain embodiments of the present disclosure provide an aircraft including a fuselage. A wing extends from the fuselage. The wing includes a front spar. An engine is supported by the first wing. An electromagnetic shielding system is mounted on the front spar proximate to the engine. The electromagnetic shielding system electrically connects a plurality of first electrical cables connected to a power source to a plurality of second electrical cables connected to the engine. The electromagnetic shielding system includes a base. A first cable coupler is frangibly coupled to the base. The first cable coupler is electrically coupled to the first electrical cables. A second cable coupler is frangibly coupled to the base. The second cable coupler is electrically coupled to the second electrical cables. A covering lid is frangibly coupled to the first cable coupler, the second cable coupler, and the base. The electrical connection chamber is defined between the base, the first cable coupler, the second cable coupler, and the covering lid. The first electrical cables are electrically connected to the second electrical cables within the electrical connection chamber.

DETAILED DESCRIPTION OF THE DISCLOSURE

The foregoing summary, as well as the following detailed description of certain embodiments will be better understood when read in conjunction with the appended drawings. As used herein, an element or step recited in the singular and preceded by the word "a" or "an" should be understood as not necessarily excluding the plural of the elements or steps. Further, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular condition may include additional elements not having that condition.

Certain embodiments of the present disclosure provide an electromagnetic shielding system, which may be formed as a shielding box. The electromagnetic shielding system is configured to protect electrical connections between one or more first electrical cables (such as power feeders) and one or more second electrical cables (such as engine cables) from external electromagnetic effects, such as lighting, electromagnetic pulses, high intensity radiated fields, and the like. In at least one embodiment, ventilation passages are formed through portions of the electromagnetic shielding system to allow airflow to cool components within the electromagnetic shielding system, such as a terminal block that electrically couples the first electrical cable(s) to the second electrical cable(s). The electromagnetic shielding system includes one or more frangible portions that are configured to break away upon exertion of a force of a predetermined magnitude, such as an engine separating from a wing of an aircraft.

Figure 1A:
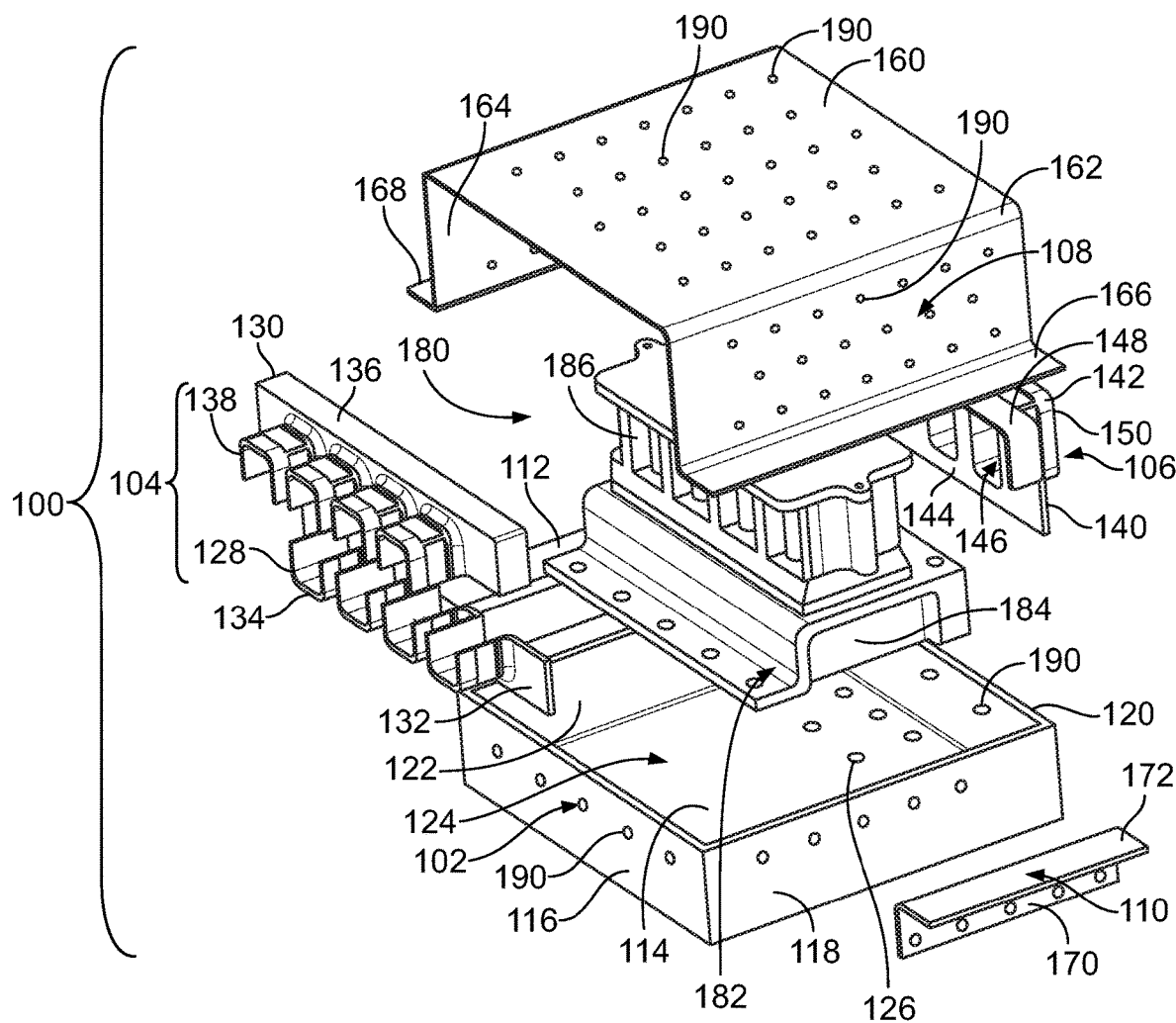
FIG. 1A is a diagrammatic representation of an exploded top perspective view of an electromagnetic shielding system, according to an embodiment of the present disclosure.

FIG. 1A is a diagrammatic representation of an exploded top perspective view of an electromagnetic shielding system 100, according to an embodiment of the present disclosure. The electromagnetic shielding system 100 includes a base 102, a first cable coupler 104, a second cable coupler 106, a covering lid 108, a first lid attachment bracket 110, and a second lid attachment bracket 112.

The base 102 includes a support plate 114. A first end wall 116 extends from the support plate 114 and connects to a first side wall 118, which also extends from the support plate 114. The first side wall 118 connects to a second end wall 120 that is opposite from the first end wall 116. A second side wall 122 extends from the support plate 114 opposite from the first side wall 118 and connects to first end wall 116 and the second end wall 120. The base 102, the first end wall 116, the first side wall 118, the second end wall 120, and the second side wall 122 may be integrally formed as a single piece, such as a single piece of metal (for example, Aluminum). An internal chamber 124 is defined between the support plate 114, the first end wall 116, the first side wall 118, the second end wall 120, and the second side wall 122. One or more fastener through holes 126 may be formed through the support plate 114. The fastener through holes 126 are configured to receive fasteners, such as rivets, bolts, or the like, that securely fasten the base 102 to a component, such as front spar of a wing of an aircraft.

The first cable coupler 104 includes a first fitting 128 that couples to a second fitting 130. The first cable coupler 104 is formed of a metal, such as Aluminum. The first fitting 128 includes a panel 132 and one or more cable collars 134 outwardly extending from the panel 132. As shown, the first fitting 128 includes four cable collars 134. Optionally, the first fitting 128 may include more or less cable collars 134, depending on the number of electrical cables that are routed to the electromagnetic shielding system 100. The second fitting 130 includes a bracket 136 that fits over the panel 132. One or more cable collars 138 outwardly extend from the bracket 136 that couple to the cable collars 134. As shown, the second fitting 130 includes four cable collars 138. Optionally, the second fitting 130 may include more or less cable collars 138, depending on the number of electrical cables that are routed to the electromagnetic shielding system 100.

The first fitting 128 and the second fitting 130 are coupled together so that outer portions of electrical cables are securely trapped between the cable collars 134 and the cable collars 138. The cable collars 134 and 138 cooperate to define cable channels into which a portions of electrical cables extend. The cable collars 134 and 138 are configured to securely and electrically couple around the portions of the electrical cables.

The first fitting 128 and the second fitting 130 may be secured together through one or more fasteners (such as rivets, bolts, or screws), adhesives, and/or the like. Because the first fitting 128 and the second fitting 130 are separate pieces, the first fitting 128 and the second fitting 130 are configured to break away from one another when subjected to a force of a predetermined magnitude. As such, the first cable coupler 104 is frangible, such that the first fitting 128 is configured to separate from the second fitting 130. The first fitting 128 connects to the second fitting 130 through a frangible connection.

The first fitting 128 is configured to secure to the first end wall 116 through one or more fasteners (such as rivets, bolts, or screws), adhesives, and/or the like. Similarly, the second fitting 130 is configured to secure to the covering lid 108 through one or more fasteners (such as rivets, bolts, or screws), adhesives, and/or the like. The first fitting 128 and the second fitting 130 are configured to break away from the first end wall 116 and the covering lid 108 when subjected to a force of a predetermined magnitude. As such, the first cable coupler 104 frangibly connects to the base 102 and the covering lid 108. The first cable coupler 104 connects to the base 102 and the covering lid 108 through frangible connections.

The second cable coupler 106 includes a third fitting 140 that couples to a fourth fitting 142. The second cable coupler 106 is formed of a metal, such as Aluminum. The third fitting 140 includes a panel 144 and one or more cable collars 146 outwardly extending from the panel 144. The third fitting 140 includes four cable collars 146. Optionally, the third fitting 140 may include more or less cable collars 146, depending on the number of electrical cables that are routed to the electromagnetic shielding system 100. The fourth fitting 142 includes a bracket 148 that fits over the panel 144. One or more cable collars 150 outwardly extend from the bracket 148 that couple to the cable collars 150. As shown, the fourth fitting 142 includes four cable collars 150. Optionally, the fourth fitting 142 may include more or less cable collars 150, depending on the number of electrical cables that are routed to the electromagnetic shielding system 100.

The third fitting 140 and the fourth fitting 142 are coupled together so that outer portions of electrical cables are securely trapped between the cable collars 146 and the cable collars 150. The cable collars 146 and 150 cooperate to define cable channels into which portions of electrical cables extend. The cable collars 146 and 150 are configured to securely and electrically couple around the portions of the electrical cables.

The third fitting 140 and the fourth fitting 142 may be secured together through one or more fasteners (such as rivets, bolts, or screws), adhesives, and/or the like. Because the third fitting 140 and the fourth fitting 142 are separate pieces, the third fitting 140 and the fourth fitting 142 are configured to break away from one another when subjected to a force of a predetermined magnitude. As such, the second cable coupler 106 is frangible, such that the third fitting 140 is configured to separate from the fourth fitting 142. The third fitting 140 connects to the fourth fitting 142 through a frangible connection.

The third fitting 140 is configured to secure to the second end wall 120 through one or more fasteners (such as rivets, bolts, or screws), adhesives, and/or the like. Similarly, the fourth fitting 142 is configured to secure to the covering lid 108 through one or more fasteners (such as rivets, bolts, or screws), adhesives, and/or the like. The third fitting 140 and the fourth fitting 142 are configured to break away from the second end wall 120 and the covering lid 108 when subjected to a force of a predetermined magnitude. As such, the second cable coupler 106 frangibly connects to the base 102 and the covering lid 108. The second cable coupler 106 connects to the base 102 and the covering lid 108 through frangible connections.

As shown, the first cable coupler 104 and the second cable coupler 106 are at opposite ends of the electromagnetic shielding system 100. In at least one other embodiment, the first cable coupler 104 and the second cable coupler 106 may be at opposite sides of the electromagnetic shielding system 100. For example, the first cable coupler 104 and the second cable coupler 106 may be coupled to the first side wall 118 and the second side wall 122, respectively. In at least one other embodiment, the first cable coupler 104 may be at one end of the electromagnetic shielding system 100, while the second cable coupler 106 may be at one side of the electromagnetic shielding system 100, or vice versa. In at least one other embodiment, a third cable coupler and a fourth cable coupler may extend from opposite sides of the electromagnetic shielding system 100, in addition to the first cable coupler 104 and the second cable coupler 106 extending from opposite ends of the electromagnetic shielding system 100.

The covering lid 108 includes a main covering wall 160 and side walls 162 and 164 downwardly extending from the main covering wall 160. The covering lid 108 may be formed of a metal, such as Aluminum. Flanges 166 and 168 outwardly extend lower edges of the side walls 162 and 164, respectively. The covering lid 108 secures onto and over the brackets 136 and 148 of the first coupler 104 and the second coupler 106, respectively, such as through fasteners, adhesives, and/or the like. The side walls 162 and 164 secure onto and around sides of the brackets 136 and 148 and the panels 132 and 144, such as through fasteners, adhesives, and/or the like. Further, the side walls 162 abut into outer surfaces of the first side wall 118 and the second side wall 122, respectively, and may be secured thereto, such as through fasteners, adhesives, and/or the like.

The covering lid 108 is configured to break away from the first cable coupler 104, the second cable coupler 106, and the base 102 when subjected to a force of a predetermined magnitude. As such, the covering lid 108 frangibly connects to the first cable coupler 104, the second cable coupler 106, and the base 102. The covering lid 108 connects to the base first cable coupler 104, the second cable coupler 106, and the base 102 through frangible connections.

The first and second attachment brackets 110 and 112 includes walls 170 that connect to flanges 172 outwardly extending from the walls 170. The walls 170 connect to respective side walls 118 and 122 through fasteners, adhesives, and/or the like. The flanges 172 connect to respective flanges 166 and 168 of the covering lid 108 through fasteners, adhesives, and/or the like. The first and second attachment brackets 110 and 112 are configured to break away from the base 102 and the covering lid 108 when subjected to a force of a predetermined magnitude. In this manner, the first and second attachment brackets 110 and 112 frangibly connect to the base 102 and the covering lid 108. The first and second attachment brackets 110 and 112 connect to the base 102 and the covering lid 108 through frangible connections.

In at least one other embodiment, the covering lid 108 may connect to the base 102 without the first and second attachment brackets 110 and 112. For example, optionally, the electromagnetic shielding system 100 may not include first and second attachment bracket 110 and 112.

As described herein, the electromagnetic shielding system 100 includes a plurality of components that are connected together through frangible connections. In particular, the base 102, the first cable coupler 104, the second cable coupler 106, the covering lid 108, the first lid attachment bracket 110, and the second lid attachment bracket 112 are connected together through frangible connections. The first cable coupler 104 and the second cable coupler 106 each include fittings that are frangibly coupled together, and also allow for ease of securing cables thereto in that cables may be laid into open cable collars, and counterpart cable collars may be closed thereover. The frangible connections allow portions of the electromagnetic shield system 100 to break away from one another when subjected to an external force of a predetermined magnitude, such as if an engine separates from a wing of an aircraft.

An electrical connection chamber 180 is defined between the base 102, the first cable coupler 104, the second cable coupler 106, and the covering lid 108. A terminal block 182 is secured to the base 102 within the electrical connection chamber 180. In particular, a support base 184 of the terminal block 182 secures to the support plate 114 of the base 102, such as through one or more fasteners, adhesives, and/or the like. The terminal block 182 includes a connection interface 186 upwardly extending from the support base 184. The connection interface 186 receives and retains exposed portions (such as leads) of first electrical cables that extend into the electrical connection chamber 180 via the first cable coupler 104 and exposed portions (such as leads) of second electrical cables that extend into the electrical connection chamber via the second cable coupler 106. The respective exposed portions of the first electrical cables and the second electrical cables electrically couple to one another within the connection interface 186.

The electromagnetic shielding system 100 shields the terminal block and portions of the first electrical cables and the second electrical cables within the electrical connection chamber 180. In particular, the base 102, the first cable coupler 104, the second cable coupler 106, and the covering lid 108 surround the terminal block 182, thereby shielding the terminal block 182 and portions of the electrical cables therein from external electromagnetic effects, such as lighting strikes, electromagnetic pulses, high intensity radiated fields, and the like.

In at least one embodiment, one or more ventilation passages 190 are formed through portions of the electromagnetic shield system 100. For example, the ventilation passages 190 may be formed through portions of the cover 108, the base 102, the first cable coupler 104, and/or the second cable coupler 106. As shown, the covering lid 108 includes a plurality of ventilation passages 190 formed through the main covering wall 160 and the side walls 162 and 164. The ventilation passages 190 allow air to flow into and out of the electrical connection chamber 180 in order to cool the terminal block 182. The electromagnetic shielding system 100 may include more or less ventilation passages 190 than shown. Alternatively, the electromagnetic shielding system 100 may not include ventilation passages 190.

Figure 1B:
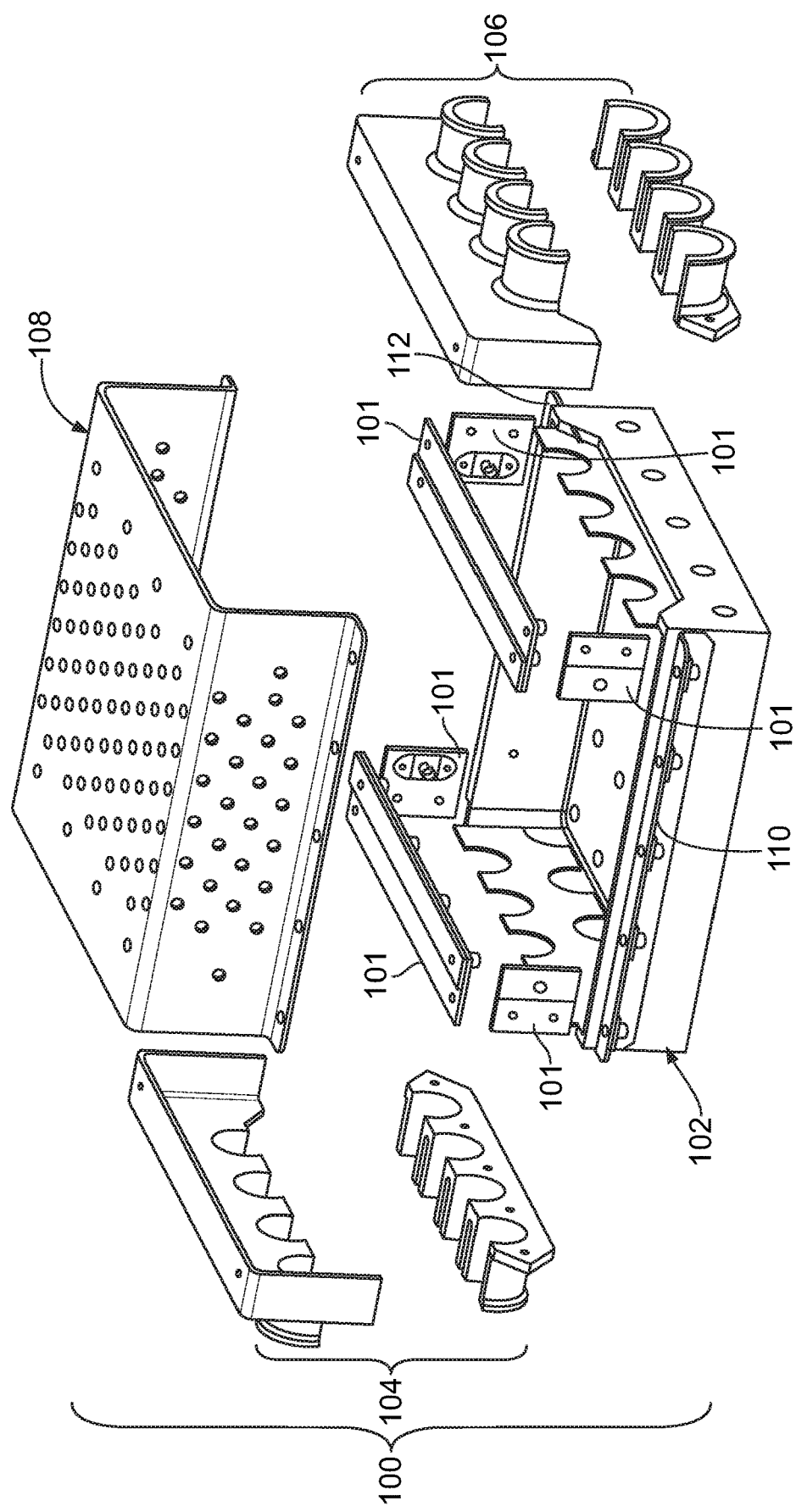
FIG. 1B is a diagrammatic representation of an exploded top perspective view of an electromagnetic shielding system, according to an embodiment of the present disclosure.

FIG. 1B is a diagrammatic representation of an exploded top perspective view of the electromagnetic shielding system 100, according to an embodiment of the present disclosure. The electromagnetic shielding system 100 includes a base 102, a first cable coupler 104, a second cable coupler 106, a covering lid 108, a first lid attachment bracket 110, and a second lid attachment bracket 112. The electromagnetic shielding system 100 includes a plurality of frangible members 101 that provide frangible connections at various locations. The frangible members 101 may include weakened areas 103 (such as seams, perforated areas, folds, or the like) at which the frangible members 101 are configured to break away upon exertion of a force of a predetermined magnitude. The frangible members 101 may be located at other and/or additional areas of the electromagnetic shielding system 100. The frangible members 101 are examples of frangible connections that may be used with any of the embodiments of the present disclosure.

Figure 2:
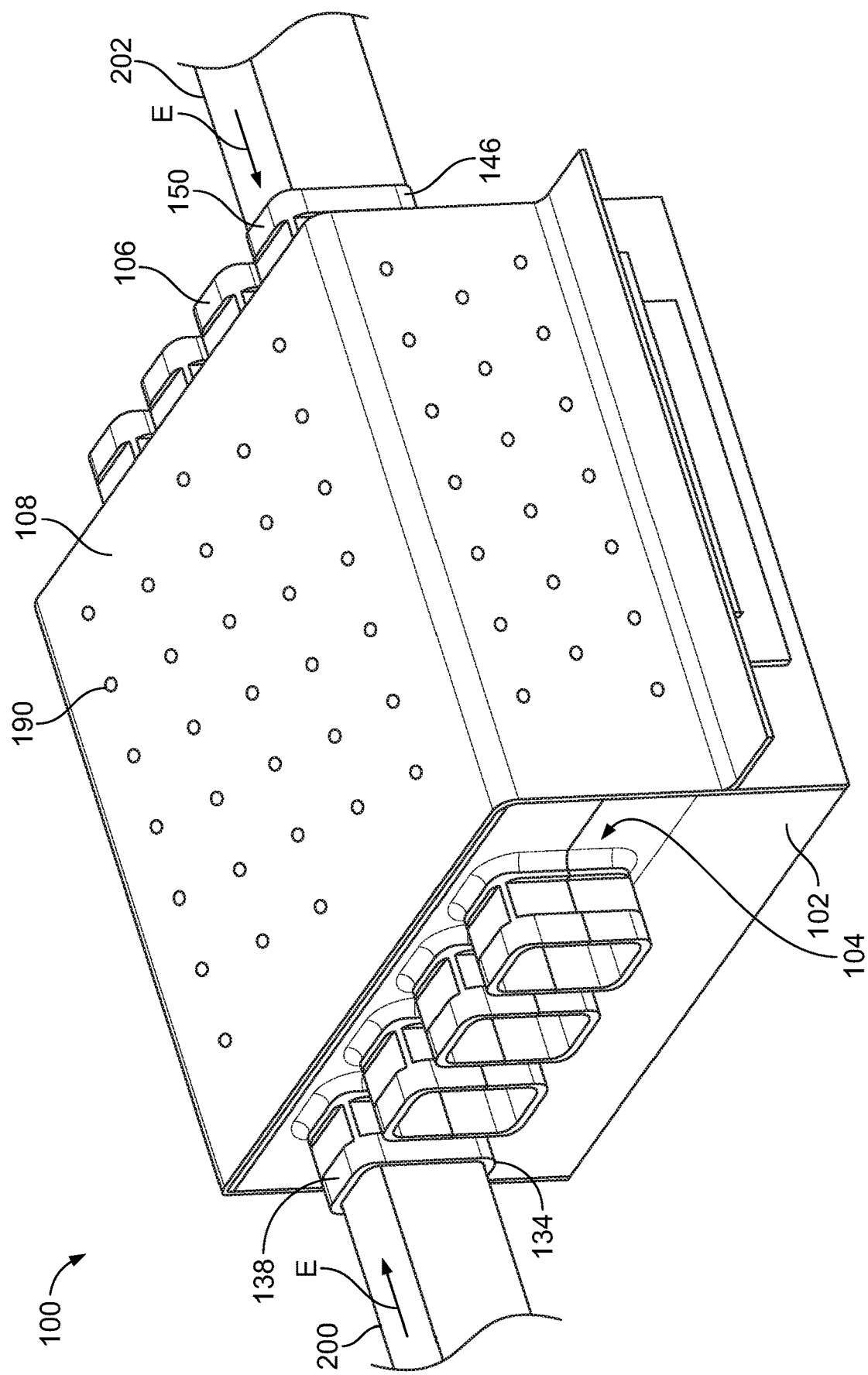
FIG. 2 is a diagrammatic representation of a top perspective of the electromagnetic shielding system.

FIG. 2 is a diagrammatic representation of a top perspective of the electromagnetic shielding system 100. Referring to FIGS. 1 and 2, the base 102, the first cable coupler 104, the second cable coupler 106, and the covering lid 108 surround and cover the terminal block 182 within the electrical connection chamber 180. First electrical cables 200 (such as power feeders extending from a power source) extend through the first cable coupler 104 into the terminal block 182, as described above. Second electrical cables 202 (such as engine cables extending from an engine) extend through the second cable coupler 106 into the terminal block 182 where they electrically couple to the first cables 200, as described above. The cable collars 134 and 138 of the first cable coupler 104 electrically and mechanically couple around outer surfaces of the first cables 200. Similarly, the cable collars 146 and 150 of the second cable coupler 106 electrically and mechanically couple around outer surfaces of the second cables 202. As such, electromagnetic energy E that travels over outer surfaces of the first cables 200 and the second cables 202 is diverted onto and around the electromagnetic shielding system 100 instead of passing into the terminal block 182 within the electrical connection chamber 180. In this manner, the electromagnetic shielding system 100 protects the terminal block and electrical connections therein from external electromagnetic threats.

Figure 3:
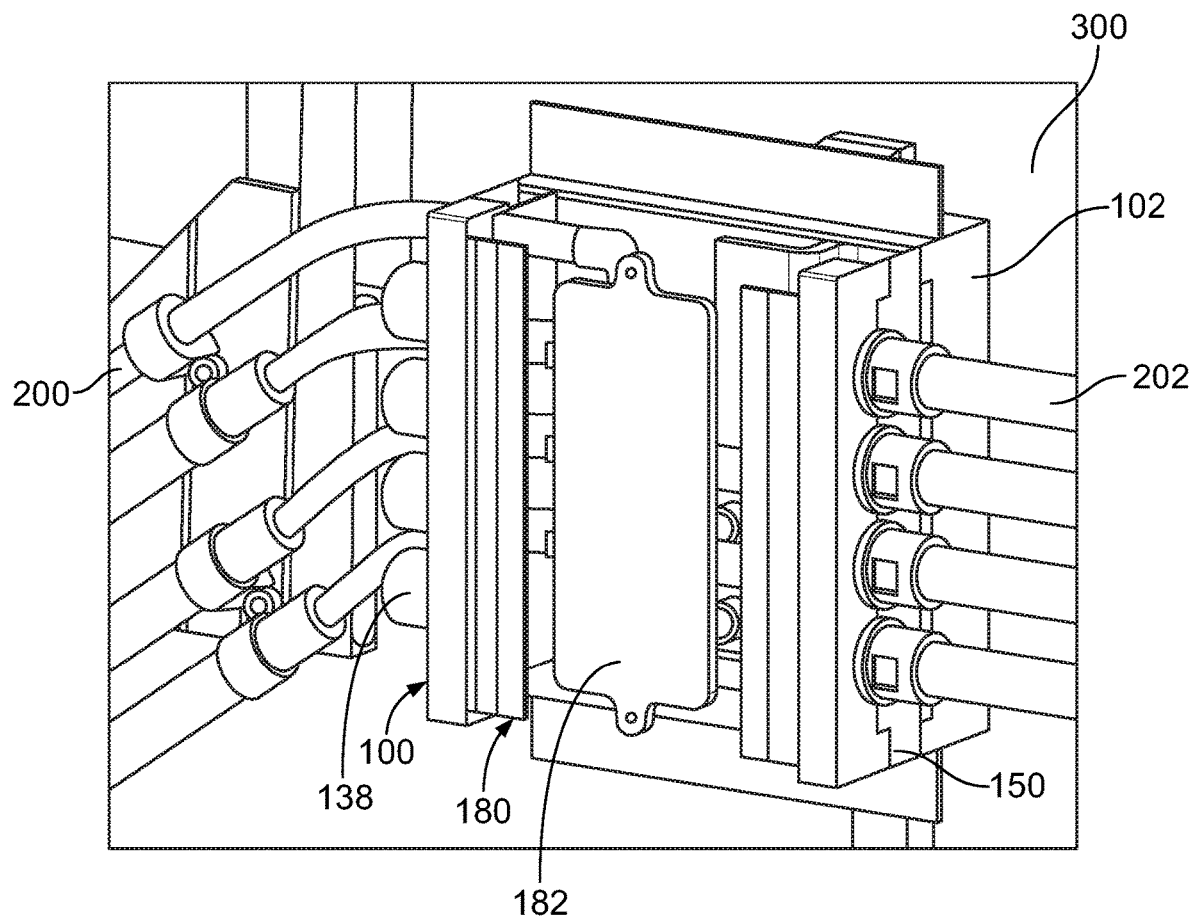
FIG. 3 is a diagrammatic representation of the electromagnetic shielding system secured to a component, according to an embodiment of the present disclosure.

FIG. 3 is a diagrammatic representation of the electromagnetic shielding system 100 secured to a component 300, according to an embodiment of the present disclosure. For the sake of clarity, the covering lid 108 (shown in FIGS. 1 and 2) is not shown in FIG. 3. The first cables 200 electrically couple to the second cables 202 within the terminal block 182. The component 300 may be a portion of an aircraft. For example, the component 300 may be a front spar of a wing of the aircraft. The base 102 is securely mounted to the component 300.

Referring to FIGS. 1-3, the cable collars 134, 138, 146, and 150 may be various shapes and sizes to accommodate cables 200 and 202 of various shapes and sizes. The cable collars 134, 138, 146, and 150 may provide semi-circular cross sections, semi-rectangular cross sections, or various other shapes.

As described herein, the electromagnetic shielding system 100 is configured to shield one or more electrical connections between the first electrical cable(s) 200 and the second electrical cable(s) 202. The electromagnetic shielding system 100 includes the base 102, the first cable coupler 104 frangibly coupled to the base 102 (wherein the first cable coupler 104 is configured to electrically couple to the first electrical cable(s) 200), the second cable coupler 106 frangibly coupled to the base 102 (wherein the second cable coupler 106 is configured to electrically coupled to the second electrical cable(s) 202), and the covering lid 108 frangibly coupled to the first cable coupler 104, the second cable coupler 106, and the base 102. The electrical connection chamber 180 is defined between the base 102, the first cable coupler 104 the second cable coupler 106, and the covering lid 108. The first electrical cable(s) 200 are configured to electrically connect to the second electrical cable(s) 202 within the electrical connection chamber 180, such as at the terminal block 182. For example, the terminal block 182 is configured to electrically connect the first electrical cable(s) 200 to the second electrical cable(s) 202.

Figure 4:
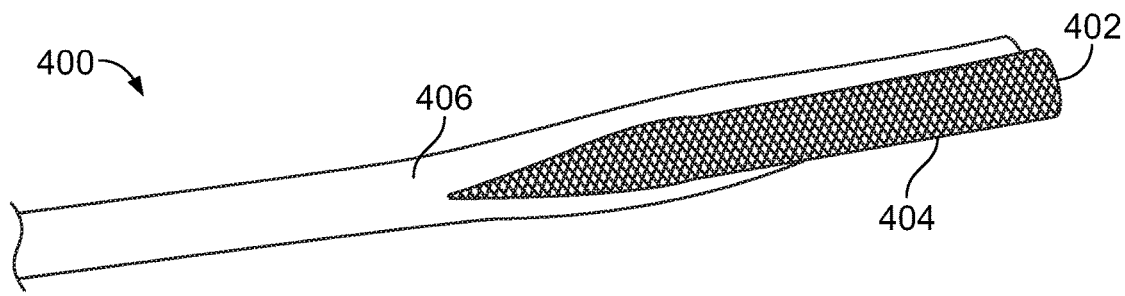
FIG. 4 is a diagrammatic representation of an electrical cable, according to an embodiment of the present disclosure.

FIG. 4 is a diagrammatic representation of an electrical cable 400, according to an embodiment of the present disclosure. The electrical cable 400 is an example of the first cable 200 and/or the second cable 202 shown in FIG. 2, for example. The electrical cable 400 includes a central core having conductive wires (hidden from view in FIG. 4) surrounded by interior insulation 402, which is in turn surrounded by a metallic shielding mesh 404. Exterior insulation 406 may surround the shielding mesh 404. The exterior insulation 406 may be removed around portions of the shielding mesh 404 that are configured to be clamped between or otherwise abut into opposed cable collars 134 and 138 or opposed cable collars 146 and 150 (shown in FIGS. 1 and 2, for example). In this manner, electromagnetic energy passing over the electrical cable 400 is diverted around the electromagnetic shielding system 100 (shown in FIGS. 1-3) instead of passing into the terminal block 182 (shown in FIGS. 1 and 3).

Figure 5:
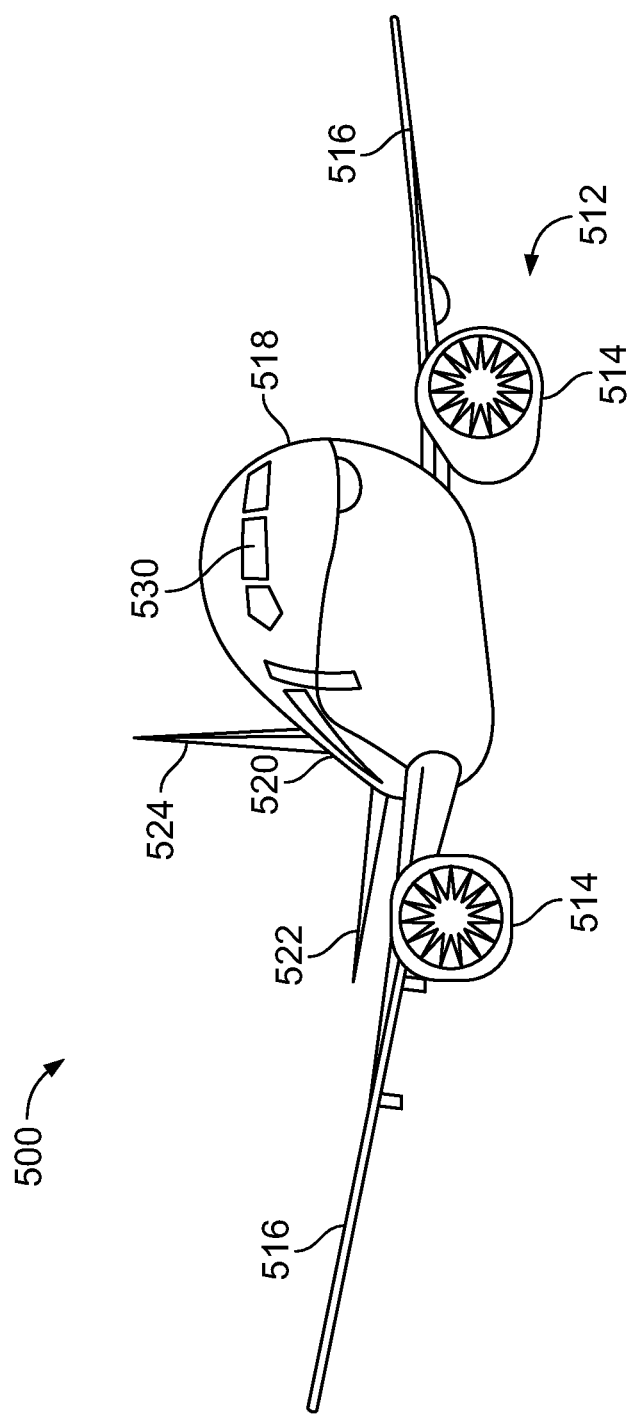
FIG. 5 is a diagrammatic representation of a front perspective view of an aircraft, according to an exemplary embodiment of the present disclosure.

FIG. 5 is a diagrammatic representation of a front perspective view of an aircraft 500, according to an exemplary embodiment of the present disclosure. The aircraft 500 includes a propulsion system 512 that may include two turbofan engines 514, for example. Optionally, the propulsion system 512 may include more engines 514 than shown. The engines 514 are carried by wings 516 of the aircraft 500. In other embodiments, the engines 514 may be carried by a fuselage 518 and/or an empennage 520. The empennage 520 may also support horizontal stabilizers 522 and a vertical stabilizer 524. The fuselage 518 of the aircraft 500 defines an internal cabin, which may include a cockpit 530. One or more electromagnetic shielding system 100 (shown in FIGS. 1-3) may be positioned within the aircraft 500.

Figure 6:
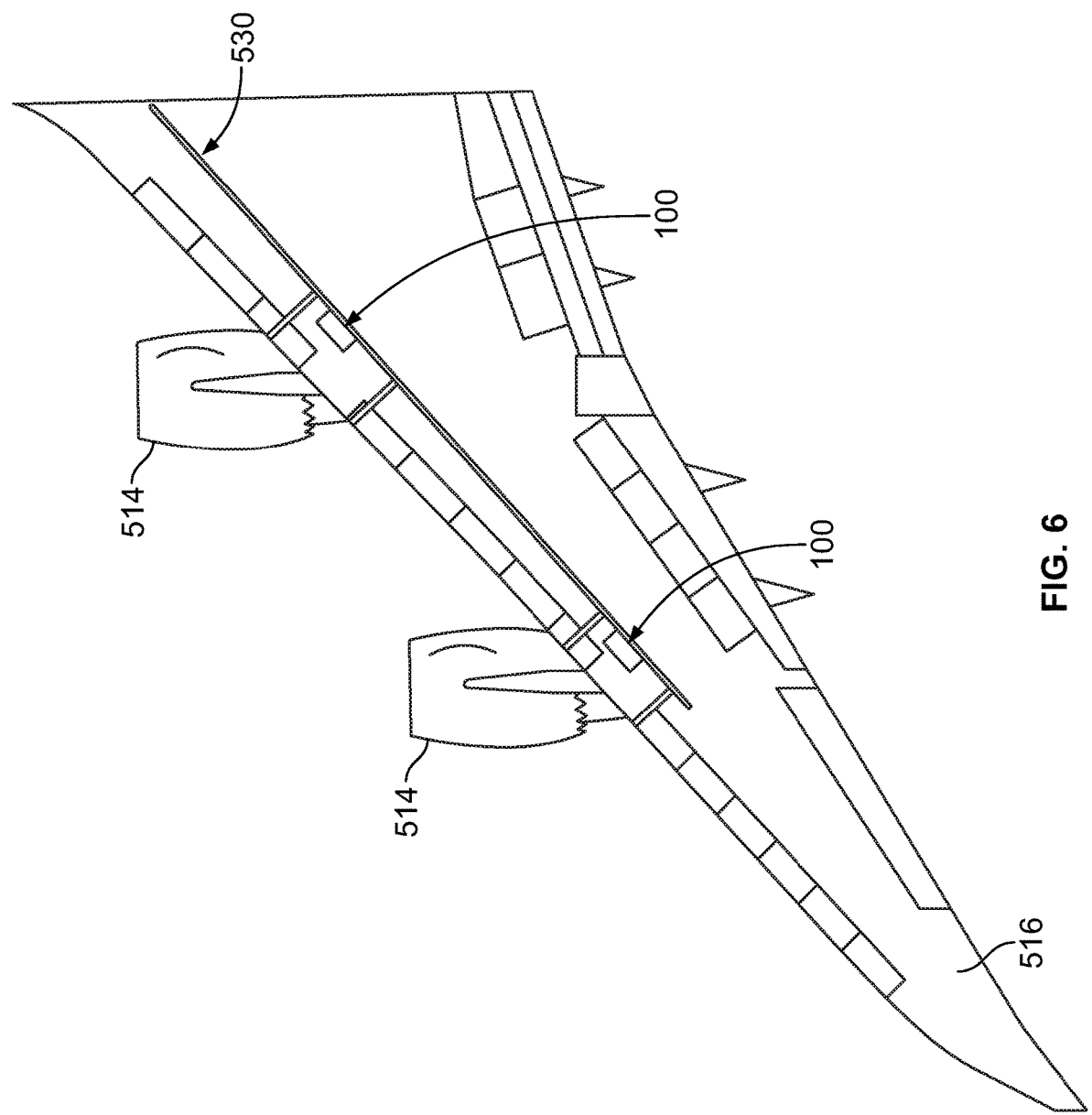
FIG. 6 is a diagrammatic representation of a wing of the aircraft, according to an embodiment of the present disclosure.

FIG. 6 is a diagrammatic representation of a wing 516 of the aircraft 500, according to an embodiment of the present disclosure. As shown, the wing 516 may support two engines 514. Electromagnetic shielding systems 100 are secured within the wing 516. For example, the electromagnetic shielding systems 100 may be secured to a front spar 550 extending along a portion of the wing 516. Each electromagnetic shielding system 100 is proximate to (for example, directly connected to, or within 10 feet or less) an engine. The electromagnetic shielding systems 100 electrically connect first cables (such as power feeders) to second cables (such as engine cables) within terminal blocks (such as the terminal blocks 182 shown in FIGS. 1 and 3). The electromagnetic shielding systems 100 shield the terminal blocks and electrical connections therein from external electromagnetic threats. Further, the frangible components of the electromagnetic shielding systems 100 are configured to break away from one another, such as if the engines 514 separate from the wings, and thereby protect fuel tanks, lines, and/or the like coupled to and/or within the wings from being damaged by separation of the engines 514.

Referring to FIGS. 5 and 6, the aircraft includes the fuselage 518 and a wing 516 extending from the fuselage 518. The wing 516 includes the front spar 550. An engine 514 is supported by the wing 516. An electromagnetic shielding system 100 (as described herein) is mounted on the front spar 550 proximate to the engine 514. The electromagnetic shielding system 100 electrically connects a plurality of first electrical cables 200 connected to a power source to a plurality of second electrical cables 202 connected to the engine 514 within the electrical connection chamber 180 (shown in FIGS. 1 and 3).

As described herein, embodiments of the present disclosure provide systems and methods for electrically shielding a terminal block within a portion of an aircraft. Further, embodiments of the present disclosure provide systems and methods for shielding electrical connections between power feeders and other cables, such as within a portion of an aircraft.

While various spatial and directional terms, such as top, bottom, lower, mid, lateral, horizontal, vertical, front and the like may be used to describe embodiments of the present disclosure, it is understood that such terms are merely used with respect to the orientations shown in the drawings. The orientations may be inverted, rotated, or otherwise changed, such that an upper portion is a lower portion, and vice versa, horizontal becomes vertical, and the like.

As used herein, a structure, limitation, or element that is "configured to" perform a task or operation is particularly structurally formed, constructed, or adapted in a manner corresponding to the task or operation. For purposes of clarity and the avoidance of doubt, an object that is merely capable of being modified to perform the task or operation is not "configured to" perform the task or operation as used herein.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments of the disclosure without departing from their scope. While the dimensions and types of materials described herein are intended to define the parameters of the various embodiments of the disclosure, the embodiments are by no means limiting and are exemplary embodiments. Many other embodiments will be apparent to those of skill in the art upon reviewing the above description. The scope of the various embodiments of the disclosure should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

This written description uses examples to disclose the various embodiments of the disclosure, including the best mode, and also to enable any person skilled in the art to practice the various embodiments of the disclosure, including making and using any devices or systems and performing any incorporated methods. The patentable scope of the various embodiments of the disclosure is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal language of the claims.

The invention claimed is:

1. An electromagnetic shielding system that is configured to shield one or more electrical connections between one or more first electrical cables and one or more second electrical cables, the electromagnetic shielding system comprising:
a base;
a first lid attachment bracket frangibly coupled to the base;
a second lid attachment bracket frangibly coupled to the base;
a first cable coupler frangibly coupled to the base, wherein the first cable coupler is configured to electrically couple to the one or more first electrical cables;
a second cable coupler frangibly coupled to the base, wherein the second cable coupler is configured to electrically couple to the one or more second electrical cables; and
a covering lid frangibly coupled to the first lid attachment bracket, the second lid attachment bracket, the first cable coupler, the second cable coupler, and the base, wherein an electrical connection chamber is defined between the base, the first cable coupler, the second cable coupler, and the covering lid, and wherein the one or more first electrical cables are configured to electrically connect to the one or more second electrical cables within the electrical connection chamber.

2. The electromagnetic shielding system of claim 1, further comprising a terminal block within the electrical connection chamber, wherein the terminal block is configured to electrically connect the one or more first electrical cables to the one or more second electrical cables.

3. The electromagnetic shielding system of claim 1, wherein the base comprises:
a support plate that is configured to be securely mounted to a component;

a first end wall extending from the support plate;
a first side wall extending from the support plate and connected to the first end wall;
a second end wall opposite from the first end wall extending from the support plate and connected to the first side wall; and
a second side wall opposite from the first side wall extending from the support plate and connected to first end wall and the second end wall.

4. The electromagnetic shielding system of claim 1, wherein the first cable coupler comprises a first fitting frangibly coupled to a second fitting.

5. The electromagnetic shielding system of claim 4, wherein the second cable coupler comprises a third fitting frangibly coupled to a fourth fitting.

6. The electromagnetic shielding system of claim 4, wherein the first fitting comprises one or more first cable collars, and wherein the second fitting comprises one or more second cable collars, wherein the first fitting is coupled to the second fitting so that outer portions of the one or more first electrical cables are securely and electrically coupled to the one or more first cable collars and the one or more second cable collars.

7. The electromagnetic shielding system of claim 1, wherein the covering lid comprises a main covering wall and side walls extending from the main covering wall.

8. The electromagnetic shielding system of claim 7, wherein the covering lid further comprises flanges outwardly extending from the side walls, wherein the flanges are frangibly coupled to lid attachment brackets.

9. The electromagnetic shielding system of claim 1, wherein one or more ventilation passages are formed through one or more of the base, the first cable coupler, the second cable coupler, or the covering lid.

10. An aircraft comprising;
a fuselage;
a wing extending from the fuselage, wherein the wing includes a front spar;
an engine supported by the wing; and
an electromagnetic shielding system mounted on the front spar proximate to the engine, wherein the electromagnetic shielding system electrically connects a plurality of first electrical cables connected to a power source to a plurality of second electrical cables connected to the engine, the electromagnetic shielding system comprising:
a base;
a first cable coupler frangibly coupled to the base, wherein the first cable coupler is electrically coupled to the first electrical cables;
a second cable coupler frangibly coupled to the base, wherein the second cable coupler is electrically coupled to the second electrical cables; and
a covering lid frangibly coupled to the first cable coupler, the second cable coupler, and the base,
wherein an electrical connection chamber is defined between the base, the first cable coupler, the second cable coupler, and the covering lid, and wherein the first electrical cables are electrically connected to the second electrical cables within the electrical connection chamber.

11. The aircraft of claim 10, wherein the electromagnetic shielding system further comprises a terminal block within the electrical connection chamber, wherein the terminal block electrically connects the first electrical cables to the second electrical cables.

12. The aircraft of claim 10, wherein the electromagnetic shielding system further comprises:
a first lid attachment bracket frangibly coupled to the base; and
a second lid attachment bracket frangibly coupled to the base,
wherein the covering lid is frangibly coupled to the first lid attachment bracket and the second lid attachment bracket.

13. The aircraft of claim 10, wherein the base comprises:
a support plate that is configured to be securely mounted to the front spar;
a first end wall extending from the support plate;
a first side wall extending from the support plate and connected to the first end wall;
a second end wall opposite from the first end wall extending from the support plate and connected to the first side wall; and
a second side wall opposite from the first side wall extending from the support plate and connected to first end wall and the second end wall.

14. The aircraft of claim 10, wherein the first cable coupler comprises a first fitting frangibly coupled to a second fitting.

15. The aircraft of claim 14, wherein the second cable coupler comprises a third fitting frangibly coupled to a fourth fitting.

16. The aircraft of claim 14, wherein the first fitting comprises first cable collars, and wherein the second fitting comprises second cable collars, wherein the first fitting is coupled to the second fitting so that outer portions of the first electrical cables are securely and electrically coupled to the first cable collars and the second cable collars.

17. The aircraft of claim 10, wherein the covering lid comprises a main covering wall, side walls extending from the main covering wall, and flanges outwardly extending from the side walls, wherein the flanges are frangibly coupled to lid attachment brackets.

18. The aircraft of claim 10, wherein one or more ventilation passages are formed through one or more of the base, the first cable coupler, the second cable coupler, or the covering lid.

19. An electromagnetic shielding system that is configured to shield one or more electrical connections between one or more first electrical cables and one or more second electrical cables, the electromagnetic shielding system comprising:
a base including a support plate that is configured to be securely mounted to a component, a first end wall extending from the support plate, a first side wall extending from the support plate and connected to the first end wall, a second end wall opposite from the first end wall extending from the support plate and connected to the first side wall, and a second side wall opposite from the first side wall extending from the support plate and connected to the first end wall and the second end wall;
a first cable coupler frangibly coupled to the base, wherein the first cable coupler is configured to electrically couple to the one or more first electrical cables, wherein the first cable coupler comprises a first fitting frangibly coupled to a second fitting, wherein the first fitting comprises one or more first cable collars, and wherein the second fitting comprises one or more second cable collars, wherein the first fitting is coupled to the second fitting so that outer portions of the one or more first electrical cables are securely and electrically coupled to the one or more first cable collars and the one or more second cable collars;

a second cable coupler frangibly coupled to the base, wherein the second cable coupler is configured to electrically couple to the one or more second electrical cables, wherein the second cable coupler comprises a third fitting frangibly coupled to a fourth fitting, wherein the third fitting comprises one or more third cable collars, and wherein the fourth fitting comprises one or more fourth cable collars, wherein the third fitting is coupled to the fourth fitting so that outer portions of the one or more second electrical cables are securely and electrically coupled to the one or more third cable collars and the one or more fourth cable collars;

a first lid attachment bracket frangibly coupled to the base;

a second lid attachment bracket frangibly coupled to the base;

a covering lid frangibly coupled to the first cable coupler, the second cable coupler, the base, the first lid attachment bracket, and the second lid attachment bracket, wherein an electrical connection chamber is defined between the base, the first cable coupler, the second cable coupler, and the covering lid, wherein the covering lid comprises a main covering wall and side walls extending from the main covering wall; and a terminal block within the electrical connection chamber, wherein the terminal block is configured to electrically connect the one or more first electrical cables to the one or more second electrical cables, wherein one or more ventilation passages are formed through one or more of the base, the first cable coupler, the second cable coupler, or the covering lid, and wherein the one or more first electrical cables are configured to electrically connect to the one or more second electrical cables within the electrical connection chamber.

20. An aircraft comprising;
a fuselage;
a wing extending from the fuselage, wherein the wing includes a front spar;
an engine supported by the wing; and
an electromagnetic shielding system mounted on the front spar proximate to the engine, wherein the electromagnetic shielding system electrically connects a plurality of first electrical cables connected to a power source to a plurality of second electrical cables connected to the engine.

21. The aircraft of claim 20, wherein the electromagnetic shielding system comprises:
a first cable coupler frangibly coupled to a base, wherein the first cable coupler is electrically coupled to the first electrical cables; and
a second cable coupler frangibly coupled to the base, wherein the second cable coupler is electrically coupled to the second electrical cables.

22. The aircraft of claim 20, wherein the electromagnetic shielding system comprises a covering lid frangibly coupled to a first cable coupler, a second cable coupler, and a base.

23. The aircraft of claim 20, wherein an electrical connection chamber is defined between a base, a first cable coupler, a second cable coupler, and a covering lid, and wherein the first electrical cables are electrically connected to the second electrical cables within the electrical connection chamber.

24. The aircraft of claim 20, wherein the electromagnetic shielding system comprises:
a first lid attachment bracket frangibly coupled to a base; and
a second lid attachment bracket frangibly coupled to the base.

25. The aircraft of claim 24, wherein a covering lid is frangibly coupled to the first lid attachment bracket, the second lid attachment bracket, and the base.

* * * * *